(12) United States Patent
Cho et al.

(10) Patent No.: US 11,696,440 B2
(45) Date of Patent: *Jul. 4, 2023

(54) NONVOLATILE MEMORY DEVICE

(71) Applicant: KEY FOUNDRY CO., LTD., Cheongju-si (KR)

(72) Inventors: Min Kuck Cho, Cheongju-si (KR); Seung Hoon Lee, Busan (KR)

(73) Assignee: KEY FOUNDRY CO., LTD., Cheongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/728,290

(22) Filed: Apr. 25, 2022

(65) Prior Publication Data

US 2022/0246627 A1    Aug. 4, 2022

Related U.S. Application Data

(63) Continuation of application No. 16/735,790, filed on Jan. 7, 2020, now Pat. No. 11,348,931.

(30) Foreign Application Priority Data

Jul. 5, 2019   (KR) .......................... 10-2019-0081626

(51) Int. Cl.
     *H10B 41/20*      (2023.01)
     *G11C 8/14*      (2006.01)
     *G11C 7/18*      (2006.01)
     *H10B 41/10*      (2023.01)

(52) U.S. Cl.
     CPC ............... *H10B 41/20* (2023.02); *G11C 7/18* (2013.01); *G11C 8/14* (2013.01); *H10B 41/10* (2023.02)

(58) Field of Classification Search
     CPC ........ H10B 41/20; H10B 41/10; H10B 41/30; H10B 41/50; H10B 41/35; H10B 41/44; H10B 41/46; H10B 41/47; G11C 7/18; G11C 8/14

See application file for complete search history.

(56) References Cited

U.S. PATENT DOCUMENTS

| | | | |
|---|---|---|---|
| 7,425,482 | B2 | 9/2008 | Jeong |
| 8,674,427 | B2 | 3/2014 | Cho et al. |
| 9,054,175 | B2 | 6/2015 | Park |
| 2006/0246659 | A1 | 11/2006 | Jeong |
| 2015/0311299 | A1 | 10/2015 | Cho et al. |

FOREIGN PATENT DOCUMENTS

| | | |
|---|---|---|
| KR | 10-2009-0074332 A | 7/2009 |
| KR | 10-2014-0121614 A | 10/2014 |
| KR | 10-1648594 B1 | 9/2016 |

OTHER PUBLICATIONS

Korean Office Action dated Dec. 27, 2020 in counterpart Korean Patent Application No. 10-2019-0081626 (4 pages in Korean).

*Primary Examiner* — Allison Bernstein
(74) *Attorney, Agent, or Firm* — NSIP Law

(57) ABSTRACT

A nonvolatile memory device includes a cell array formed on a substrate, and a control gate pickup structure, wherein the cell array comprises floating gates, and a control gate surrounding the floating gates, wherein the control gate pickup structure comprises a floating gate polysilicon layer, a control gate polysilicon layer surrounding the floating gate polysilicon layer and connected to the control gate, and at least one contact plug formed on the control gate polysilicon layer.

15 Claims, 15 Drawing Sheets

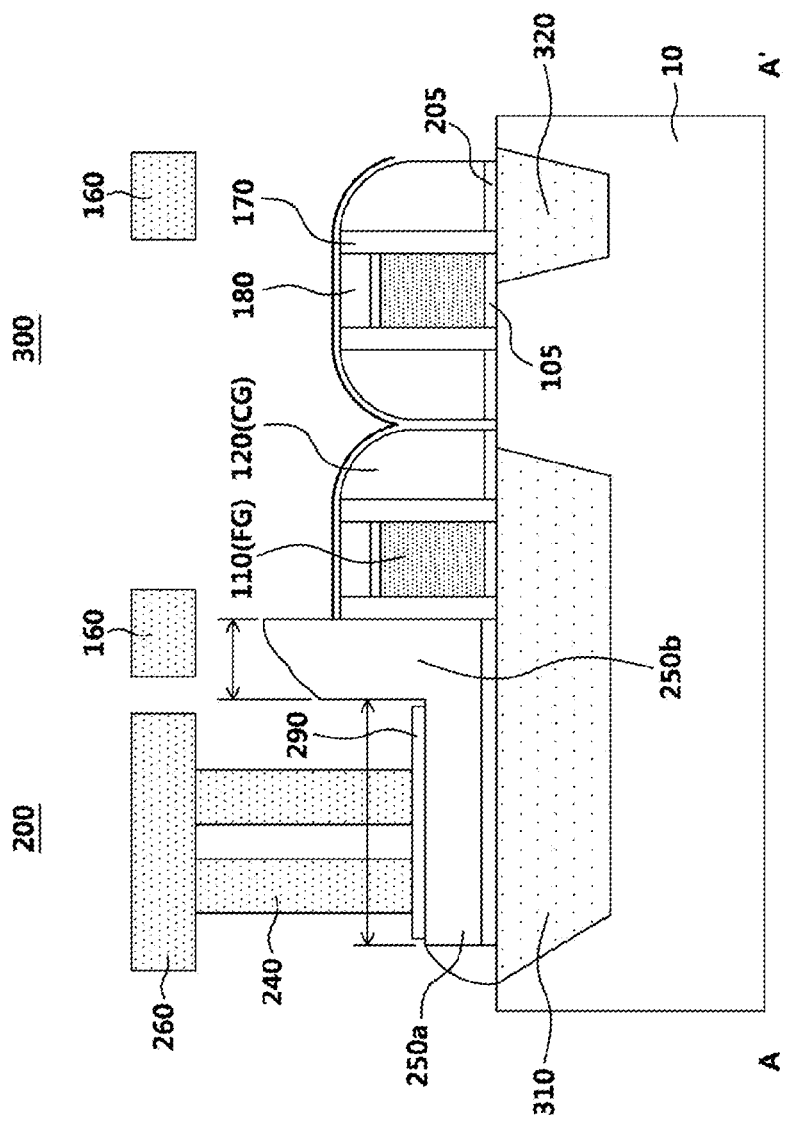

NONVOLATILE MEMORY DEVICE

CROSS-REFERENCE TO RELATED APPLICATIONS

This application is a continuation of U.S. patent application Ser. No. 16/735,790 filed on Jan. 7, 2020 which claims the benefit under 35 U.S.C. 119(a) of Korean Patent Application No. 10-2019-0081626 filed on Jul. 5, 2019 in the Korean Intellectual Property Office, the entire disclosure of which is incorporated herein by reference for all purposes.

BACKGROUND

1. Field

The following description relates to a nonvolatile memory device. The following description also relates to a nonvolatile memory device including a plurality of cells and a control gate pickup structure.

2. Description of Related Art

A nonvolatile memory device is being used in a variety of application fields. The importance of such a nonvolatile memory device is also increasing because of the advantage of such a memory device that data stored in nonvolatile memory cells is not lost even if supplied power is cut. A flash memory device and an EEPROM (Electrical Erasable Programmable Read Only Memory) device have been known as example nonvolatile memory devices.

In nonvolatile memory devices according to the related art, the control gate pickup structure may include a polysilicon peak. A polysilicon peak may form a control gate polysilicon layer through an etch-back process. A polysilicon peak refers to a configuration of the polysilicon that is partially remaining without being etched, due to a photoresist, in the manufacturing process.

When a polysilicon peak exists, an issue occurs in that a stability of the device may decrease and a height may be required in keeping with the size of the polysilicon peak. Furthermore, a leakage current may be generated by a polysilicon peak. Furthermore, a polysilicon peak may change in peak height during a manufacturing process. Accordingly, when the peak height is larger than a reference height, a short may be generated by contact with a metal wire connected to each device. Accordingly, the memory devices may not operate properly or may otherwise be broken. Therefore, it is helpful to provide a control gate pickup structure without a polysilicon peak when manufacturing a nonvolatile memory device.

Furthermore, in a nonvolatile memory device, the more the quantity of nonvolatile memory cells that are included in the same physical area, the more the memory capacity is increased. Accordingly, it is helpful to put more nonvolatile memory cells in the same area at a minimized cost.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a nonvolatile memory device includes a cell array formed on a substrate, and a control gate pickup structure, wherein the cell array includes floating gates, and a control gate surrounding the floating gates, wherein the control gate pickup structure comprises a floating gate polysilicon layer, a control gate polysilicon layer surrounding the floating gate polysilicon layer and connected to the control gate, and at least one contact plug formed on the control gate polysilicon layer.

The control gate pickup structure may further include a dielectric film formed between the floating gate polysilicon layer and the control gate polysilicon layer.

The floating gates may each has a long axis and a short axis, and a direction of the long axis has a shape tilted with respect to an X-axial direction.

The cell array may further include a bit line, a word line, a source line, a bit line contact formed in a first active region of the substrate, and a source line contact formed in a second active region of the substrate, wherein the word line is connected to the at least one contact plug formed on the control gate polysilicon layer.

The cell array may include odd rows and even rows, and the floating gates in the odd rows and the floating gates in the even rows may have directions different from each other.

The floating gates in the odd rows may be tilted positively (+) with respect to the X-axial direction, and the floating gates in the even rows may be tilted negatively (−) with respect to the X-axial direction.

The cell array may include unit cells in X-axial and Y-axial directions, and unit cells configured in the Y-axial direction may be formed on one active region.

In another general aspect, a nonvolatile memory device includes a cell array formed on a substrate, and a control gate pickup structure, wherein the cell array includes floating gates, and a control gate surrounding the floating gates, wherein each of the floating gates is tilted with respect to an X-axis.

The control gate pickup structure may include a control gate polysilicon layer, a floating gate polysilicon layer, and a word line contact connected to the control gate polysilicon layer.

The cell array may include a bit line contact formed in a first active region of the substrate, and a source line contact formed in a second active region of the substrate.

The cell array may include odd rows and even rows, floating gates in the odd rows may be tilted positively (+) with respect to an X-axis, and floating gates in the even rows may be tilted negatively (−) with respect to the X-axis.

In another general aspect, a nonvolatile memory device includes a cell array formed on a substrate, and a control gate pickup structure, wherein the cell array comprises floating gates, and a control gate surrounding the floating gates, wherein the control gate pickup structure includes a floating gate polysilicon layer, a control gate polysilicon layer surrounding the floating gate polysilicon layer and connected to the control gate, and at least one contact plug formed on the control gate polysilicon layer.

The control gate pickup structure may further include a dielectric film formed between the floating gate polysilicon layer and the control gate polysilicon layer.

The cell array may include floating gates, wherein the floating gates each has a long axis and a short axis, and a direction of the long axis may have a shape tilted with respect to an X-axial direction.

The cell array may further include a control gate surrounding the floating gates.

The cell array may include odd rows and even rows, and the floating gates in the odd rows and the floating gates in the even rows may have directions different from each other.

Other features and aspects will be apparent from the following detailed description, the drawings, and the claims.

BRIEF DESCRIPTION OF THE DRAWINGS

FIG. 13 is a cross-sectional view showing a nonvolatile memory device including a control gate pickup structure according to another example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
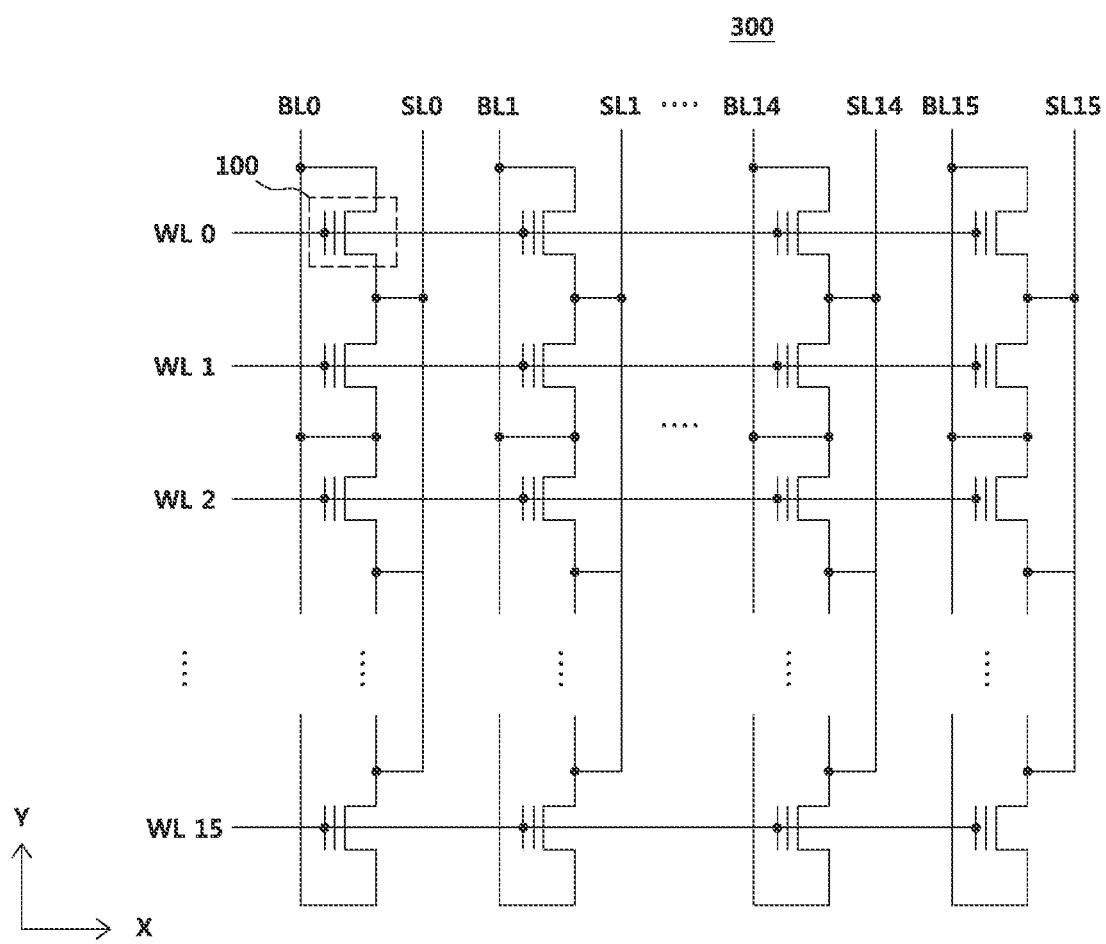
FIG. 1 is a circuit diagram about a memory cell array of a nonvolatile memory device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Expressions referring to a portion such as "part" or "unit" used in the present disclosure mean that a corresponding component may refer to a device that may include a specific function, or a combination of a device and software that may include specific functions, but are not construed as being necessarily limited to the functions and provided for helping generally understand the present disclosure, and those skilled in the art may make various changes and modifications from the description.

Further, it should be noted that all electrical signals used in the present disclosure are examples and the signs of all electrical signal to be described hereafter may be changed in opposite way when a reverser, and so on, are additionally provided in a circuit of the present disclosure. Accordingly, the extent of rights associated with the present disclosure is not limited by the directions of signals.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

An object of the present disclosure is to provide a nonvolatile memory device including a control gate pickup structure without a polysilicon peak.

Furthermore, an object of the present disclosure is to provide a nonvolatile memory device including a plurality of more cells in the same area.

Subsequently, a nonvolatile memory device according to the present examples is described in greater detail with reference to the accompanying drawings.

FIG. 1 is a circuit diagram about a memory cell array of a nonvolatile memory device according to an example.

Referring to the example of FIG. 1, a cell array 300 according to such an example includes a plurality of unit nonvolatile memory cell 100. The cell array 300 according to an example includes a plurality of word lines WL0-WL15 elongated in a row direction or X-axial direction, and a plurality of bit lines BL0-BL15 elongated in a column direction or Y-axial direction. Furthermore, the cell array includes a plurality of non-volatile memory cells 100 located at points where the word lines WL and the bit lines BL cross at right angles to one another. Furthermore, control gates CG of the non-volatile memory cells 100 are respectively connected with the word lines WL0-WL15, drain regions of the non-volatile memory cells 100 are respectively connected with the bit lines BL0-BL15, and source regions of the non-volatile memory cells 100 are respectively connected with source lines SL0-SL15.

Figure 2:
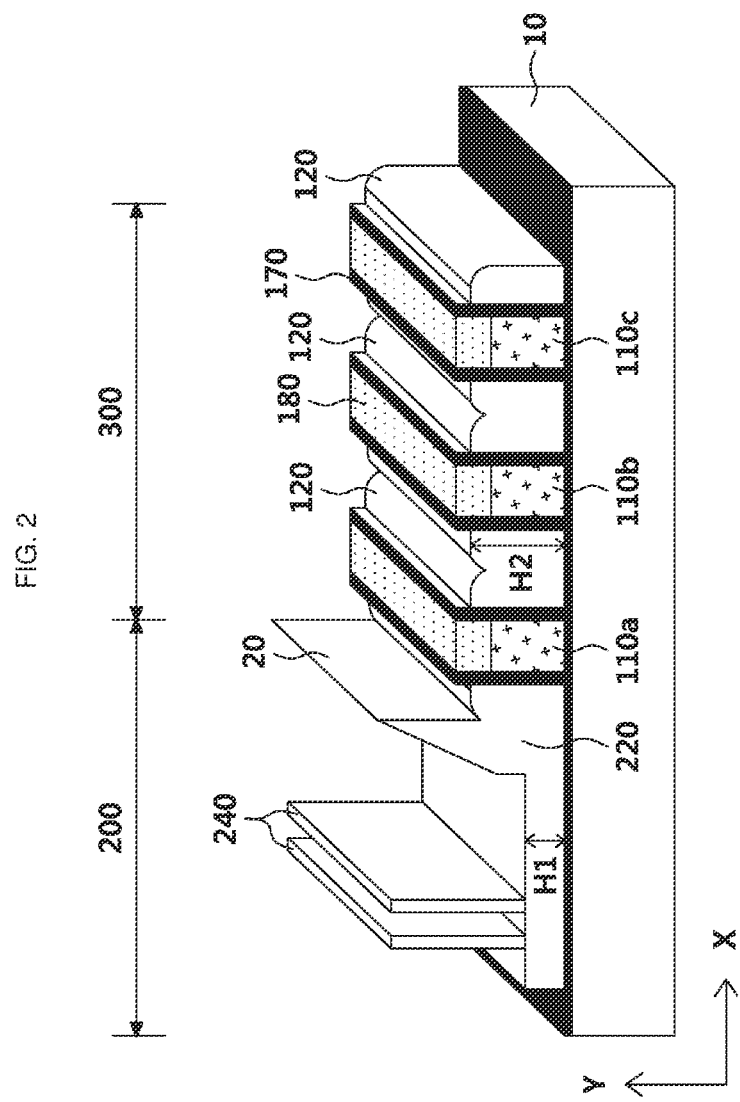
FIG. 2 is a diagram three-dimensionally showing a nonvolatile memory device according to a comparative example.

FIG. 2 is a diagram three-dimensionally showing a nonvolatile memory device according to a comparative example.

As shown in the example of FIG. 2, a polysilicon peak 20 formed on a gate control polysilicon 220 that is used as a pickup structure of a control gate may be seen. Such a polysilicon peak 20 is a polysilicon peak 20 formed as a result of a manufacturing process. However, silicide may not be able to be formed at the polysilicon peak, and hence there is a resultant issue of an increase in resistance of the entire control gate.

Figure 3:
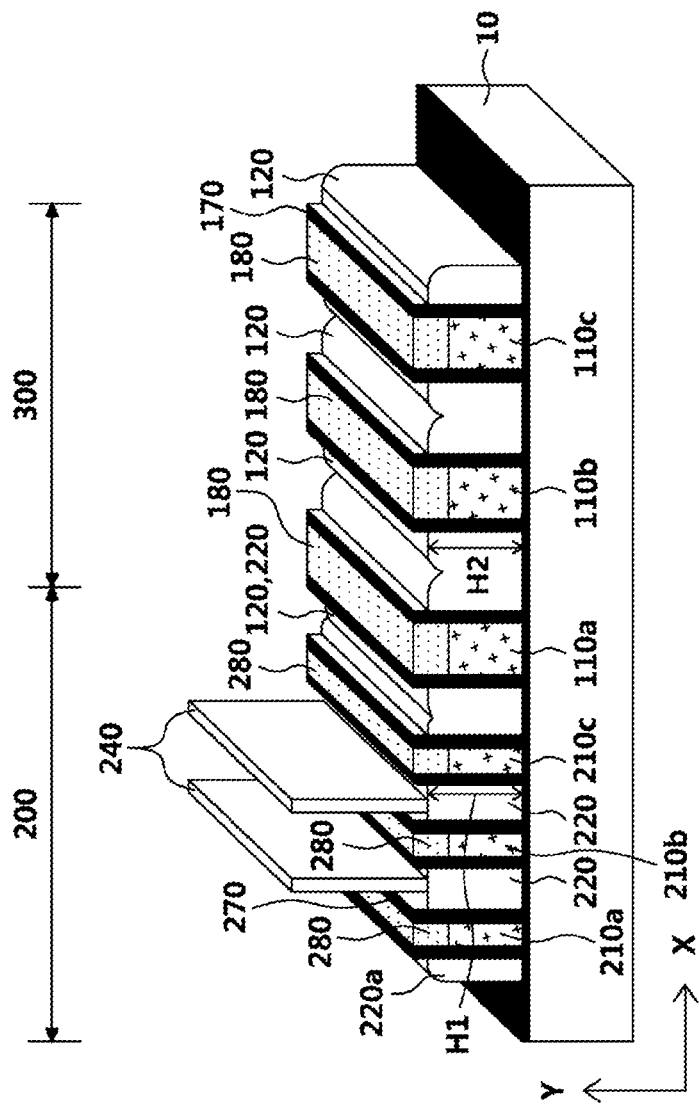
FIG. 3 is a diagram three-dimensionally showing a nonvolatile memory device including a control gate pickup structure according to an example.

FIG. 3 is a diagram three-dimensionally showing a nonvolatile memory device including a control gate pickup structure according to an example.

Referring to the example of FIG. 3, a nonvolatile memory device including a control gate pickup structure according to an example may include a cell array 300 and a control gate pickup structure 200 that are formed on a substrate 10. The cell array 300 may include a plurality of floating gates 110a, 110b, and 110c and one control gate 120 surrounding the plurality of floating gates. The control gate pickup structure 200 may include floating gate polysilicon layers 210a, 210b, and 210c, a control gate polysilicon layer 220 surrounding the floating gate polysilicon layers, and at least one contact plug 240 formed on the control gate polysilicon layer 220. The control gate polysilicon layer 220 may be a nonvolatile memory device connected to a control gate 120 of the cell array 300.

According to the example of FIG. 3, the polysilicon peak described above as being present in the example of FIG. 2 is not formed. The way in which this configuration is achieved is that the floating gate polysilicon layers 210a, 210b, and 210c and the control gate polysilicon layer 220 are alternately formed on the control gate pickup structure 200. Thus, there is no such floating gate polysilicon in the control gate pickup structure 200 in the example of FIG. 2. Accordingly, in the example of FIG. 2, the height H1 of the control gate polysilicon in the control gate pickup structure 200 is significantly smaller than the height H2 of the control gate of the cell array 300. On the contrary, in the example shown in FIG. 3, the floating gate polysilicon layers 210a, 210b, and 210c are formed in the control gate pickup structure 200. Accordingly, the height H1 of the control gate polysilicon in the control gate pickup structure 200 is almost the same as the height H2 of the control gate of the cell array 300. because H1 and H2 are almost the same height, a polysilicon peak is not formed when the control gate polysilicon 220 is patterned as in the example of FIG. 3.

According to the example of FIG. 3, the heights of the plurality of floating gates (FG) 110a, 110b, and 110c in the cell array 300 and the heights of the floating gate polysilicon layers (FG Poly-Si layers) 210a, 210b, and 210c in the control gate pickup structure 200 are the same as each other. Furthermore, the heights of floating gates (FG) 110a, 110b, and 110c and insulating films 180 and 280 formed on the floating gate polysilicon layer (FG Poly-Si layer) 210 are also the same as each other. The insulating films 180 and 280 shown in the example of FIG. 3 are films that are used as hard masks when a floating gate electrode is formed.

According to the example of FIG. 3, the widths of the plurality of floating gates (FG) 110a, 110b, and 110c in the cell array 300 are the same as each other. The widths of the plurality of floating gate polysilicon layers (FG Poly-Si layers) 210a, 210b, and 210c in the control gate pickup structure 200 are also the same as each other. However, it may be preferable that the widths of the plurality of floating gate polysilicon layers (FG Poly-Si layers) 210a, 210b, and 210c in the control gate pickup structure are smaller than the corresponding widths of the floating gates (FG) 110a, 110b, and 110c in the cell array 300. This reduction of widths may be provided for reducing the overall area of the entire chip.

Figure 4:
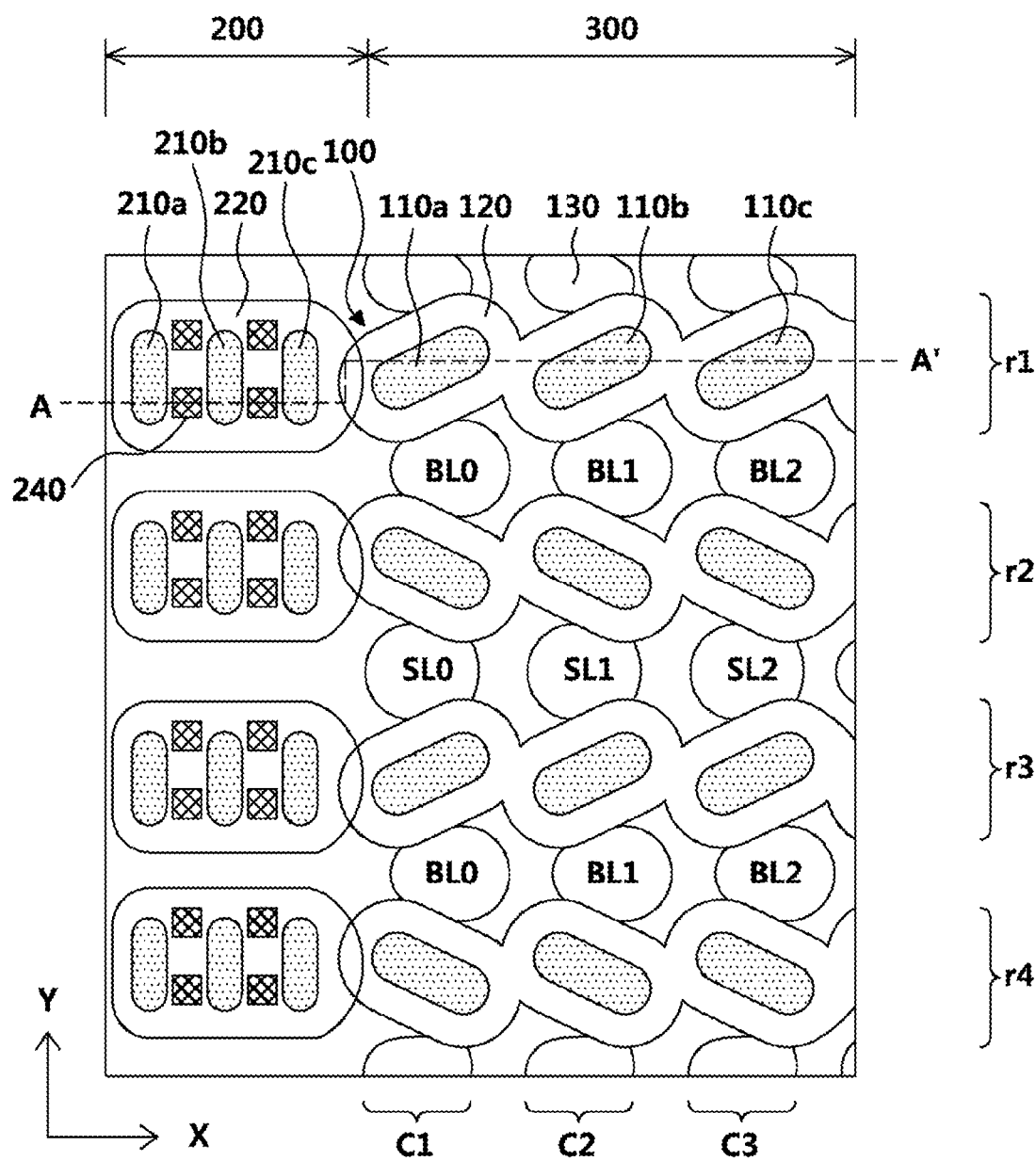
FIG. 4 is a plan view showing the nonvolatile memory device including a control gate pickup structure according to an example.

According to the example of FIG. 3, control gates (CG) 120 respectively surrounding the floating gates (FG) 110a, 110b, and 110c in the cell array 300 meet one another, as shown in the example of FIG. 4, and the portions where the control gates (CG) 120 meet one another may be formed to have groove shapes by being recessed downward while being formed.

Control gate polysilicon layers 220 respectively surrounding the floating gate polysilicon layers (FG Poly-Si layers) 210a, 210b, and 210c also meet one another, as shown in the example of FIG. 4, and the surfaces of the control gate polysilicon layers 220 are substantially flatter than the surface of the control gates (CG) 120 in the cell array 300. Accordingly, because the surfaces of the control gate polysilicon layers 220 are substantially flatter in an example, it follows that curves in such structures are not as severe. Such a structure is achieved because the widths of the control gate polysilicon layers 220 are smaller than the widths of the control gates (CG) 120.

According to the example of FIG. 3, at least one contact plug 240 electrically connected with the control gate polysilicon layer 220 is formed. The contact plug 240 may be used to apply an appropriate voltage for a programming operation and a reading operation to the control gate polysilicon layer 220. The contact plug 240 may be formed between the floating gate polysilicon layers (FG Poly-Si layers) 210a, 210b, and 210c. Although two contact plugs 240 are shown as being formed in the example of FIG. 3, the examples of the present disclosure are not limited to such a specific number of pieces, and different numbers of pieces are used in other examples. However, the contact plug 240 and the floating gate polysilicon layers (FG Poly-Si layers) 210a, 210b, and 210c are not in contact with each other.

According to the example of FIG. 3, a first dielectric film 170 may be formed between the floating gates (FG) 110a, 110b, and 110c and the control gates (CG) 120 in the cell array 300. For example, an oxide film-nitride film-oxide film (ONO) may be used as the dielectric film. However, in other examples, other dielectric films with similar electric properties may be used, as appropriate. Furthermore, a second dielectric film 270 may be formed between the control gate polysilicon layer 220 and the floating gate polysilicon layers (FG Poly-Si layers) 210a, 210b, and 210c.

FIG. 4 is a plan view showing the nonvolatile memory device including a control gate pickup structure according to an example.

According to the example of FIG. 4, a cell array 300 comprises a plurality of floating gates 110a, 110b, and 110c in each row r1, r2, r3 and r4, a single control gate 120 surrounding the plurality of floating gates in each row r1, r2, r3 and r4, and bit line contacts BL0, Bl1, Bl2 and source line contacts SL0, SL1, SL2 between rows. Also, as shown in the example of FIG. 4, the long axis of the plurality of floating gates 110a, 110b, and 110c may be tilted up or down with respect to the X-axis in each row.

According to the example of FIG. 4, the control gate pickup structure 200 may comprise one control gate polysilicon layer 220, a plurality of floating gate polysilicon layers 210a, 210b, and 210c, and a plurality of word line contacts 240 connected with the control gate polysilicon layers. The control gate polysilicon layer 220 may accordingly be a nonvolatile memory device formed such that the X-axial length is larger than the Y-axial length in a plan view. Furthermore, the control gate polysilicon layer 220 may have a shape in which the central axis of the control gate polysilicon layer is parallel with the X-axial direction. Accordingly, the control gate polysilicon layer 220 may be a structure surrounding the plurality of floating gate polysilicon layers 210a, 210b, and 210c. In such an example, the control gate polysilicon layer 220 is thus physically and electrically connected with the control gates 120 of the cell array 300. Accordingly, when a voltage is applied to the control gate polysilicon layer 220 through the contact plug 240, the same voltage or electric potential is applied to all the control gates 120 of the cell array 300 due to the connections between such elements.

According to the example of FIG. 4, the cell array 300 is a nonvolatile memory device including: bit line contacts BL0, BL1, BL2 formed in a first active region of the substrate; and source line contacts SL0, SL1, SL2 formed in a second active region of the substrate. The bit line contacts BL0, BL1, BL2 are all electrically connected with bit lines BL. Further, the source line contacts SL0, SL1, SL2 are all electrically connected with source lines SL.

According to the example of FIG. 4, the cell array is a nonvolatile memory device comprising a plurality of odd rows and even rows and in which the floating gates 110a, 110b, and 110c of the odd rows r1 and r3 are tilted positively (+) with respect to the X-axial direction and the floating gates 110a, 110b, and 110c of the even rows r2 and r4 are tilted negatively (−) with respect to the X-axial direction. In such an example, the cell array may have a floating gate structure, in which the odd rows r1 and r3 and the even rows r2 and r4 are symmetric to each other with respect to the source line contacts SL0, SL1, SL2. Similarly, the cell array may have a structure in which the odd rows r1 and r3 and the even rows r2 and r4 are symmetric to each other with respect to the bit line contacts BL0, BL1, BL2. Accordingly, the nonvolatile memory device according to the present examples may be able to include a plurality of additional cells 100 in the same physical area. Also, as described above, in an example, the floating gates of the odd rows and the floating gates of the even rows may have directions and/or physical orientations different from each other.

As another example, the floating gates of the odd rows and the floating gates of the even rows may have directions and/or physical orientations the same as each other.

According to the example of FIG. 4, the control gates (CG) 120 that the plurality of cells 100 respectively include are all electrically connected to each other, and the control gates (CG) 120 are also electrically connected to the control gate pickup structure. Furthermore, the control gates (CG) 120 are electrically connected with word line WL elongated in the column direction. Accordingly, when a signal is applied to the word line WL, the signal is also transmitted to each of the cells 100 through the control gate lines (CG) 120, so the plurality of cells 100 of a nonvolatile semiconductor device is controlled by such a signal.

According to the example of FIG. 4, it is an aspect of the example that the control gates (CG) 120 are formed not only over the floating gates (FG) 110a, 110b, and 110c, but also in the present examples, the control gates (CG) 120 may have a characteristic of surrounding the floating gates (FG) 110a, 110b, and 110c at the sides of the floating gates (FG) 110a, 110b, and 110c.

Figure 5:
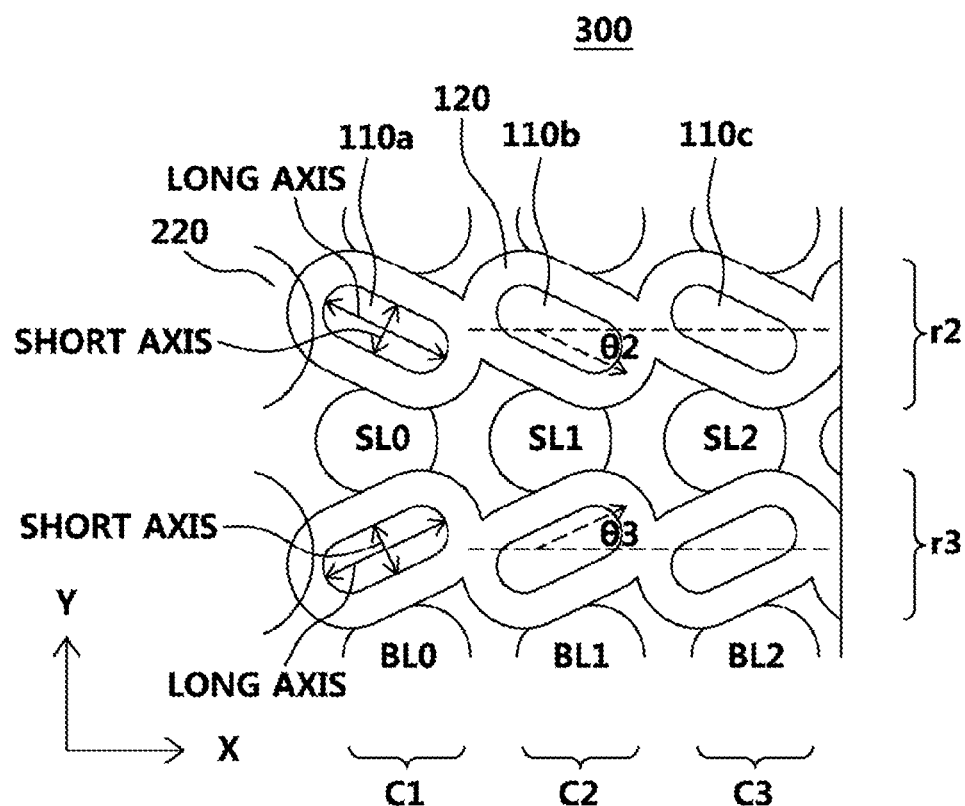
FIG. 5 is a plan view enlarging the cell array in the example of FIG. 4.

FIG. 5 is a plan view showing the nonvolatile memory device including a control gate pickup structure according to an example.

FIG. 5 is a view enlarging the cell array 300 more than the example of FIG. 4. In the example of FIG. 5, the floating gates 110a, 110b, and 110c each have a long axis and a short axis in the plurality of cells 100. The reason that the floating gates 110a, 110b, and 110c each have a long axis and a short axis, as shown, is to increase cell density in a specific area.

Accordingly, in such an example, the floating gate electrode may be provided with a long elliptical structure. The long axis may be tilted or inclined from the X-axial direction, where the X-axis is the direction of the word line WL. As described above, because the long axis is tilted or inclined from the word line WL, the nonvolatile memory device according to the present examples may increase cell density in the same overall area.

The plurality of cells 100 may each be disposed in a different direction from the word line WL. That is, in one example, the plurality of cells may be formed to all be inclined in one direction in one row r2 or r3. Alternatively, in another example the cells may be formed to each be inclined in directions different from each other. Furthermore, because the pattern of a mask has only to be differently formed in accordance with preparing the cells in this manner, the difference of the inclinations does not even complicate the manufacturing process of a nonvolatile memory device.

As shown in the example of FIG. 5, the floating gates 110a, 110b, and 110c may be nonvolatile memory devices that have a long axis and a short axis and may have a shape in which the direction of the long axis is tilted up or down with respect to the X-axial direction. With reference to the floating gate 110b in the second row r2, the direction of the long axis has an angle θ2 by which it is tilted down with respect to the X-axial direction. Referring to the floating gate 110b in the third row r3, the direction of the long axis has an angle θ3 by which it is tilted up with respect to the X-axial direction. Furthermore, the floating gate 110b has a floating gate structure in which the second row r2 and the third row r3 are symmetric to each other with respect to the source line contacts SL0-SL2. Similarly, the floating gate 110b has a structure in which the second row r2 and the third row r3 are symmetric to each other with respect to the bit line contacts BL0-BL2, and the angle the angle θ2 and angle θ3 may be tilted further as additional cells of the plurality of cells 100 are added.

Figure 6A:
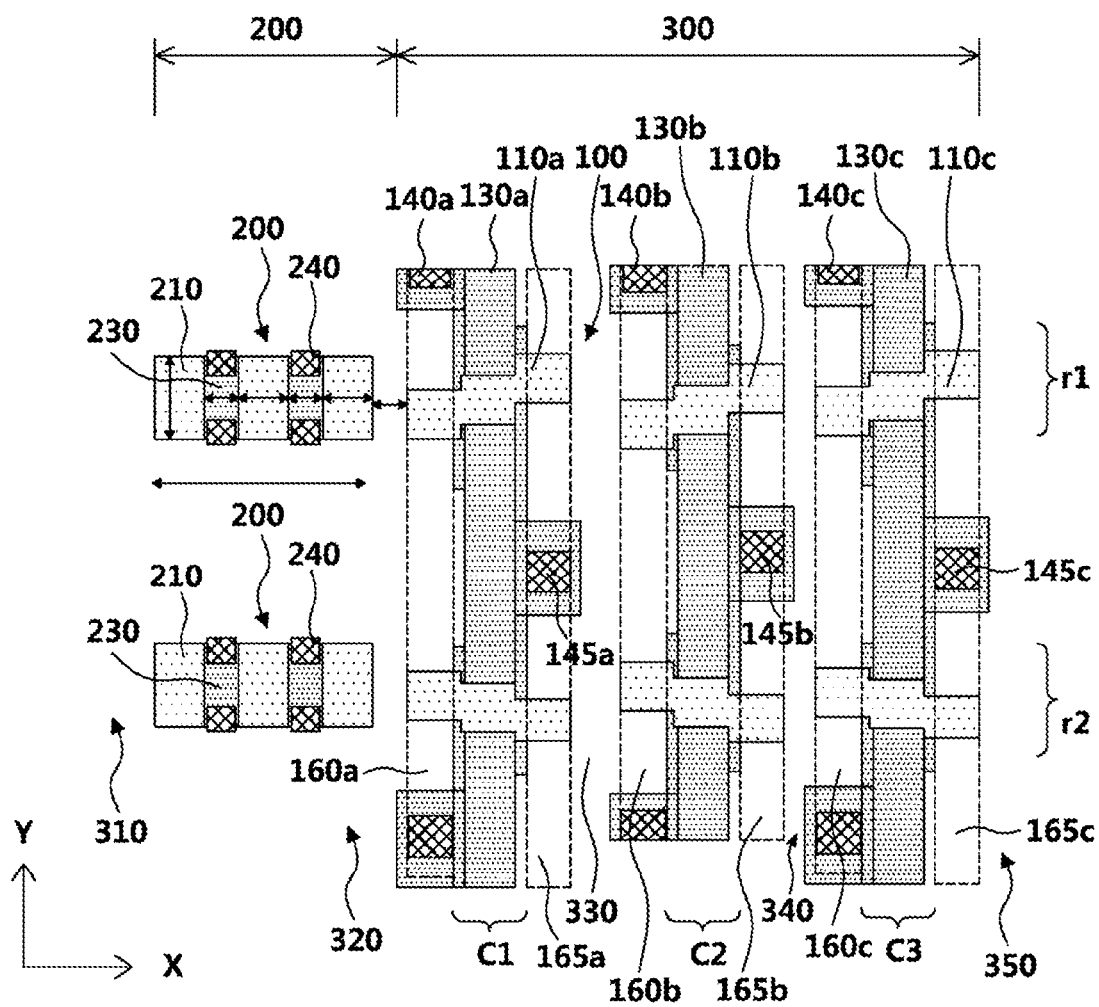
FIG. 6A is layout diagrams showing the nonvolatile memory device including a control gate pickup structure according to an example.
Figure 6B:
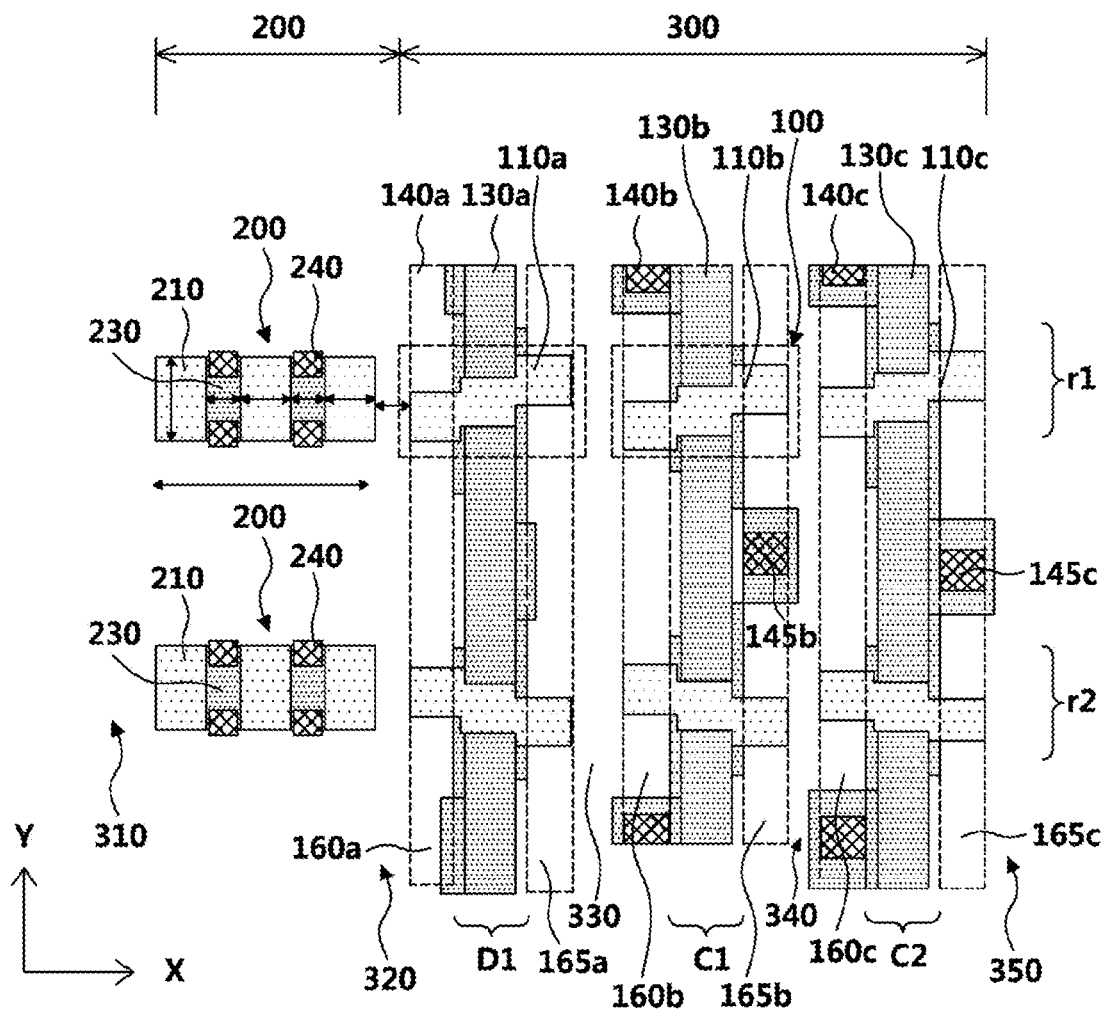
FIG. 6B is another layout diagrams showing the nonvolatile memory device including a control gate pickup structure according to an example.

FIGS. 6A and 6B are layout diagrams showing the nonvolatile memory device including a control gate pickup structure according to an example.

According to the example of FIG. 6A, the cell array 300 may include floating gates (FG) 110a, 110b, and 110c, and a control gate pickup structure 200 electrically connected to the plurality of cells 100. The cell array 300 comprises a plurality of unit cells disposed in the X-axial and Y-axial directions. The plurality of unit cells 100 disposed in the Y-axial direction are formed on one active region 130a, 130b, or 130c.

Figure 7:
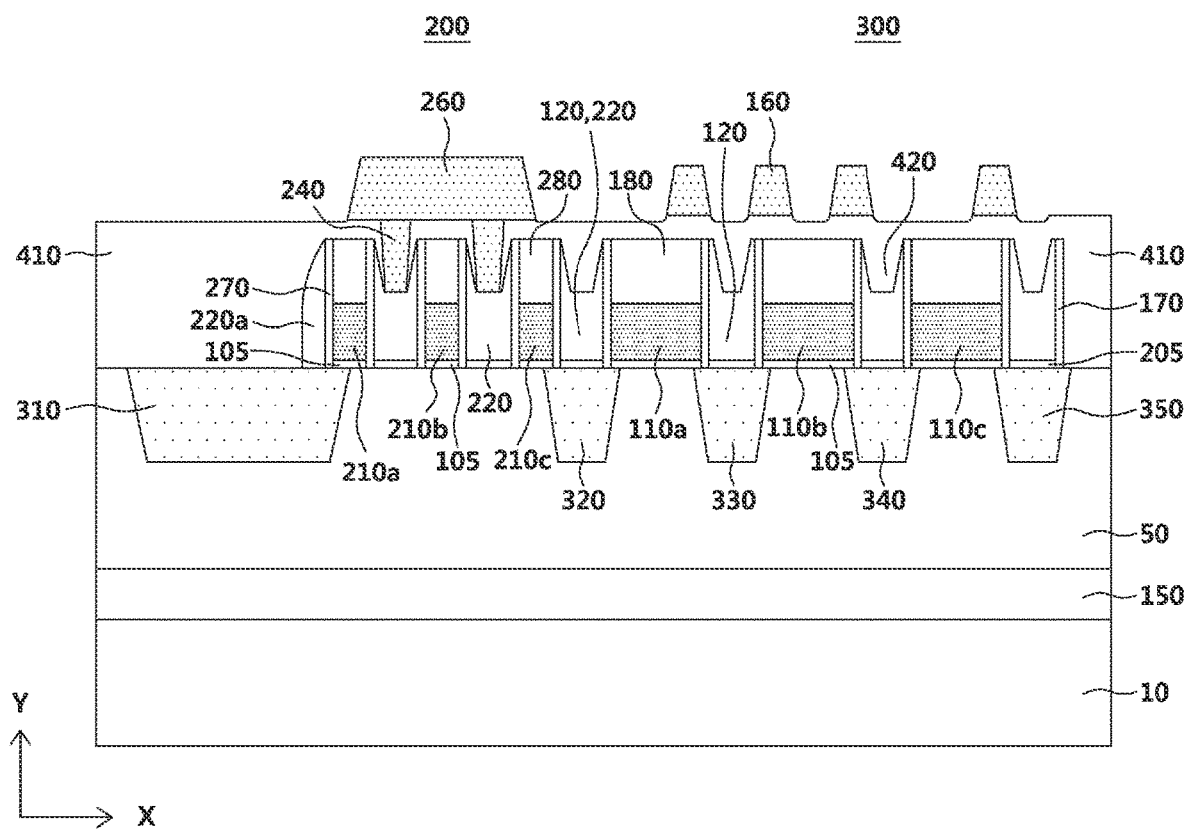
FIG. 7 is a diagram showing a cross-section of the nonvolatile memory device including a control gate pickup structure according to an example

Furthermore, in the plurality of unit cells disposed in the X-axial direction, a first isolation insulating film 320 is formed between the first floating gate 110a and the second floating gate 110b, as shown in both the example of FIG. 6A and also the example of FIG. 7. In the same manner, a second isolation insulating film 330 is formed between second floating gate 110b and the third floating gate 110c. In other words, in such an example, the first isolation insulating film 320 divides a first cell line C1 and a second cell line C2. Furthermore, the second isolation insulating film 330 divides the second cell line C2 and a third cell line C3. In such an example, the first cell line C1 is also referred to as the outmost cell line. The second cell line C2 and the third cell line C3 are also referred to as an internal cell line.

According to the example of FIG. 6A, bit line contacts 140a, 140b, and 140c and source line contacts 145a, 145b, and 145c are formed in the cell array 300. In order to form the bit line contacts 140a, 140b, and 140c and the source line contacts 145a, 145b, and 145c, active regions 130a, 130b, and 130c may be formed to partially protrude at both sides of the active regions 130a, 130b, and 130c. The active regions 130a, 130b, and 130c may extend toward the isolation insulating film 320.

The bit line contacts 140a, 140b, and 140c and the source line contacts 145a, 145b, and 145c may be formed at the protruding portions. Drain regions of the plurality of cells 100 may be connected to the bit lines BL. The bit lines BL may be electrically connected to each other using adjacent bit lines and metal wires 160a, 160b, and 160c. The source lines SL may also be electrically connected to each other using adjacent source lines and metal wires 165a, 165b, and 165c. The metal wires 160a, 160b, 160c, 165a, 165b, and 165c may be formed to respectively apply a voltage to the bit lines and the source lines of the plurality of cells 100.

According to the example of FIG. 6A, the floating gates 110a, 110b, and 110c may each have a long axis and a short axis, wherein the long axis may be tilted up or down with respect to the X-axial direction. Referring to the floating gate 110b in the first row r1, the direction of the long axis has an angle tilted up with respect to the X-axial direction. Referring to the floating gate 110b in the second row r2, the direction of the long axis has an angle tilted down with respect to the X-axial direction. Furthermore, the example of FIG. 6A has a floating gate structure in which the first row r1 and the second row r2 are symmetric to each other with respect to the source line contacts SL0-SL2. Similarly, it has a structure in which the second row r2 and the third row r3 (not shown) are symmetric to each other with respect to the bit line contacts BL0-BL2.

According to the example of FIG. 6A, it is preferable that the control gate pickup structure according to an embodiment of the present disclosure has a triple floating gate polysilicon layer (FG Poly-Si layer) 210. At least one contact plug 240 is formed among the floating gate polysilicon layers (FG Poly-Si layers) 210. Although two contact plugs 240 are formed in FIG. 6A, the extent of right of the present disclosure is not limited to the number of pieces. The contact plug 240 is formed on the control gate polysilicon layer 220. In the example of FIG. 6A, the contact plugs 240 seem to be formed on the active region 230, but they are shown like that because the control gate polysilicon layer 220 is removed in the layout. Actually, the contact plugs 240 are formed on the control gate polysilicon layer 220 (not shown) to apply a voltage to the control gate.

However, the contact plug 240 and the floating gate polysilicon layer (FG Poly-Si layer) 210 should not be in contact with each other, so it is preferable that a sufficient space is formed each between the triple floating gate polysilicon layers (FG Poly-Si layers) 210. When the contact plug 240 and the floating gate polysilicon layer (FG Poly-Si layer) 210 are in contact, there is a malfunction occurred in a corresponding nonvolatile memory device.

According to the example of FIG. 6A, the floating gate polysilicon layer (FG Poly-Si layer) 210 of the control gate pickup structure is formed to have a long axis and a short axis. The long axis is formed in a direction, such as a Y-axis perpendicular to the word line WL. It is preferable that the short axis is formed in a direction, such as an X-axis that is parallel with the word line WL.

FIG. 6B is another layout diagrams showing the nonvolatile memory device including a control gate pickup structure according to an example.

According to the example of FIG. 6B, the cell array 300 comprises at least one dummy cell line D1. The dummy cell line D1 may be disposed to be adjacent to the first cell line C1. Thus, the dummy cell line D1 may be disposed between the first cell line C1 and the control gate pickup structure 200. The dummy cell line D1 may be connected to the control gate pickup structure 200. However, no bit line contacts or source line contacts may be formed in the dummy cell line D1. Also, the bit line contacts 140a, 140b, and 140c and the source line contacts 145a, 145b, and 145c may be formed in the first, second and third cell lines C1, C2 and C3.

In such an example, the control gate poly-Si 220 in the control gate pickup structure 200 may be electrically connected to the control gate (CG) 120 formed in the internal cell lines, because the control gate 120 in the dummy cell D1 may be connected to both the control gate poly-Si 220 in the control gate pickup structure 200 and the control gate (CG) 120 formed in the first, second and third cells C1, C2 and C3.

The dummy cell line D1 helps during fine patterning of outermost cell C1 in the cell array 300. If outermost cell C1 is able to be formed as the exact same pattern of second cell line C2, there would be no resulting problem from the operation of the EEPROM without a formation of the dummy cell line D1. During the actual formation process, the outermost cell unit may be more unstable than the internal cell. In particular, in the case of specific cells, they often violate the Design rule (DR) provided for the memory cells due to process variations. Therefore, the outermost pattern that is considered to be unstable in the actual manufacturing process is set to Dummy, and correctly patterned cells are used inside. However, if the outermost cell is able to be defined accurately and without problems, there is no need to use a dummy cell unit, reducing waste. One dummy cell line D1 or two dummy cell units in the cell array 300 may be used for fine patterning of the outmost cell line C1.

FIG. 7 is a diagram showing a nonvolatile memory device including a control gate pickup structure according to an example.

FIG. 7 is a view showing a cross-section taken along line A-A' of the example of FIG. 4. A substrate 10 may be a P-type conductive substrate 10. A deep N-type well 150 may be formed on the substrate 10 to isolate the active region from the substrate 10. A P-type well 50 may be formed on the deep N-type well 150. A plurality of trench isolation regions 310, 320, 330, 340 and 350 may be formed in the P-type well region 50 to separate the floating gates 110a, 110b and 110c from each other in the cell array 300.

Floating gates (FG) 110a, 110b, and 110c may be formed over the well region 50 in the cell array 300. A tunneling oxide film 105 may be formed between the floating gates (FG) 110a, 110b, and 110c and the substrate 10. The tunneling oxide film 105 may electrically separate the floating gates (FG) 110a, 110b, and 110c and the substrate 10 from each other. Accordingly, movement of electrons injected into the floating gates (FG) 110a, 110b, and 110c may be blocked by the tunneling oxide film 105, so information may be stored in the floating gates (FG) 110a, 110b, and 110c. However, depending on situations, such as when a threshold voltage is applied, electrons may pass through the tunneling oxide film 105 through a tunneling phenomenon.

A hard mask layer 180 may be formed on the floating gates (FG) 110a, 110b, and 110c. The hard mask layer 180 may be used to etch floating gate polysilicon. The hard mask 180 may comprise an oxide film, a nitride film, or a stacked oxide film/nitride film. However, these are only examples and other appropriate films may be used as the hard mask 180. Furthermore, a dielectric film 170 surrounding the sides of the floating gates (FG) 110a, 110b, and 110c may be formed.

A control gate insulating film 205 may be formed on the substrate 10. A control gate (CG) 120 may be formed on the control gate insulating film 205. A control gate (CG) 120 may be disposed between the floating gates (FG) 110a, 110b, and 110c. A control gate (CG) 120 may also surround all the floating gates (FG) 110a, 110b, and 110c in a top view. The dielectric film 170 may separate the control gate (CG) 120 from the floating gates (FG) 110a 110b, and 110c. However, depending on examples, electrons may move through the dielectric film 170 through an electron tunneling phenomenon. An inter-dielectric layer (ILD) 410 may be formed on the control gate 120. Also, a hollow or groove 420 may be formed on the control gate 120 in the cell array 300 due to an etch-back process for formation of the control gate.

According to the example of FIG. 7, a control gate pickup structure may include floating gate polysilicon layers (FG Poly-Si layers) 210a, 210b, and 210c formed on the substrate 10, dielectric films 270 formed on both sides of each of the floating gate polysilicon layers (FG Poly-Si layers) 210a, 210b, and 210c. A control gate polysilicon layer 220 may be formed between the floating gate polysilicon layers (FG Poly-Si layers) 210a, 210b, and 210c. A space shape control gate polysilicon layer 220a may be further formed adjacent to the outmost floating gate polysilicon layer 210a. The space shape control gate polysilicon layer 220a may be formed due to an etch-back process of the control gate polysilicon layer.

A hollow or groove 420 may also be formed on the control gate polysilicon layer 220 in the control gate pickup structure 200 due to an etch-back process used for formation of the control gate. An interlayer insulating film (ILD) 410 may also be formed on the control gate polysilicon layer 220. By etching the ILD 410, at least one contact plug 240 may be formed in the ILD 410 to electrically connect the control gate polysilicon layer 220. The contact plugs 240 may be disposed on the hollow or the groove 420 formed on the control gate polysilicon layer 220. The contact plug 240 may be connected with a metal wire 260 formed on the interlayer insulating film 410. The contact plug 240 and the floating gate polysilicon layers (FG Poly-Si layers) 210 may be formed so as not to be in contact with each other, so it is preferable that a sufficient space is formed among the double floating gate polysilicon layers (FG Poly-Si layer) 210 to facilitate the separation of the contact plug 240 and the floating gate polysilicon layers (FG Poly-Si layers) 210.

According to the example of FIG. 7, the control gate pickup structure also further includes a hard mask 280 on the floating gate polysilicon layers (FG Poly-Si layers) 210a, 210b, and 210c. In this example, it may be preferable that an oxide film, a nitride film, or an oxide film/nitride film is used as the hard mask 280. However, it is possible to use another film with similar physical properties as the hard mask 280 in other examples, though not preferred.

According to the example of FIG. 7, the respective heights of the floating gates (FG) 110a, 110b, and 110c are smaller than the height of the control gate (CG) 120 in the cell array 300. When the hard mask 180 is further included on the floating gates (FG) 110a, 110b, and 110c, the hard mask 180 may have a thickness corresponding to the height that matches the difference in height between the floating gates (FG) 110a, 110b, and 110c and the control gate (CG) 120.

According to the example of FIG. 7, the heights of the floating gate polysilicon layers (FG Poly-Si layers) 210a, 210b, and 210c are smaller than the height of the control gate polysilicon layer 220. When the insulating film 280 is further formed on the floating gate polysilicon layers (FG Poly-Si layers) 210a, 210b, and 210c, the insulating film 280 has a thickness by the height that is the difference between the floating gate polysilicon layers (FG Poly-Si layers) 210a, 210b, and 210c and the control gate polysilicon layer 220.

According to the example of FIG. 7, first and second isolation insulating films 310, 320, 330, 340 and 350 disposed on the semiconductor substrate 10 may be formed. The first isolation insulating film 310 may be formed under the control gate pickup structure. Furthermore, a plurality of second isolation insulating films 320, 330, 340 and 350 may be formed in the cell array 300. The second isolation insulating films may be formed to overlap the floating gates (FG) 110a, 110b, and 110c and the control gate (CG) 120. Accordingly, in the plurality of unit cells configured in the X-axial direction, the floating gate 110a may be a nonvolatile memory device in which an isolation insulating film 320, 330, 340 and 350 may be formed between adjacent floating gates 110b. Accordingly, in such an example, an adjacent floating gate 110a and the floating gate 110b may be electrically insulated from each other. Additionally, the first and second isolation 310, 320, 330, 340 and 350 may be formed of STI (Shallow Trench Isolation) and/or DTI (Deep Trench Isolation) structures.

Figure 8:
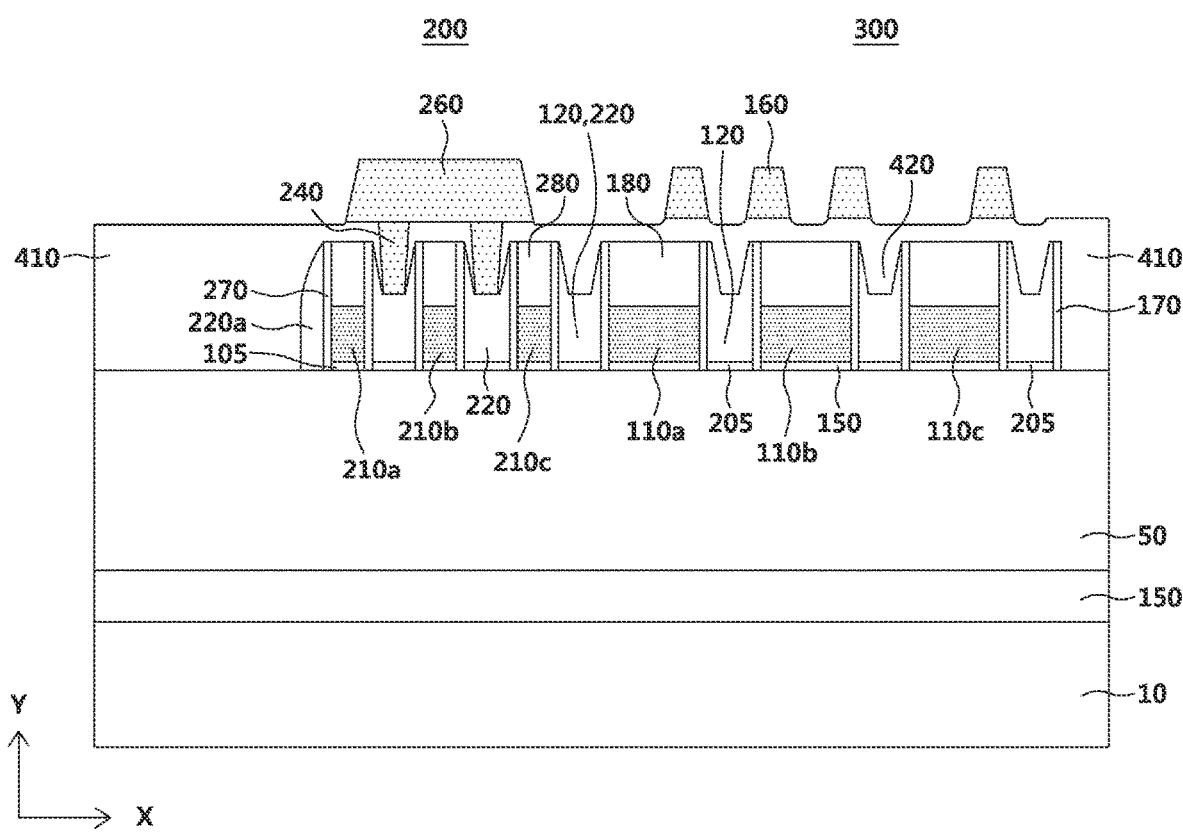
FIG. 8 is a diagram showing a cross-section of a nonvolatile memory device not including an isolation insulating film under a control gate pickup structure according to an example.

FIG. 8 is a diagram showing a cross-section of a nonvolatile memory device not including the isolation insulating films 310, 320, 330, 340 and 350 under a control gate pickup structure according to an example.

According to the example of FIG. 8, another example includes a cell array 300 and a control gate pickup structure 200. The cell array 300 may include a tunneling oxide film 105, floating gates (FG) 110a, 110b, and 110c, a control gate insulating film 205 and a control gate (CG) 120. The control gate pickup structure 200 may be connected to the control gate (CG) 120. The isolation insulating films 310, 320, 330, 340 and 350 may not be included under the plurality of cells 100. The control gate pickup structure may be connected to the control gate (CG) 120. Subsequently, a nonvolatile memory device according to another example is described in further detail with reference to the accompanying drawings. For reference, another example describes only different aspects, as compared with other examples, and the same aspects are omitted.

Figure 9:
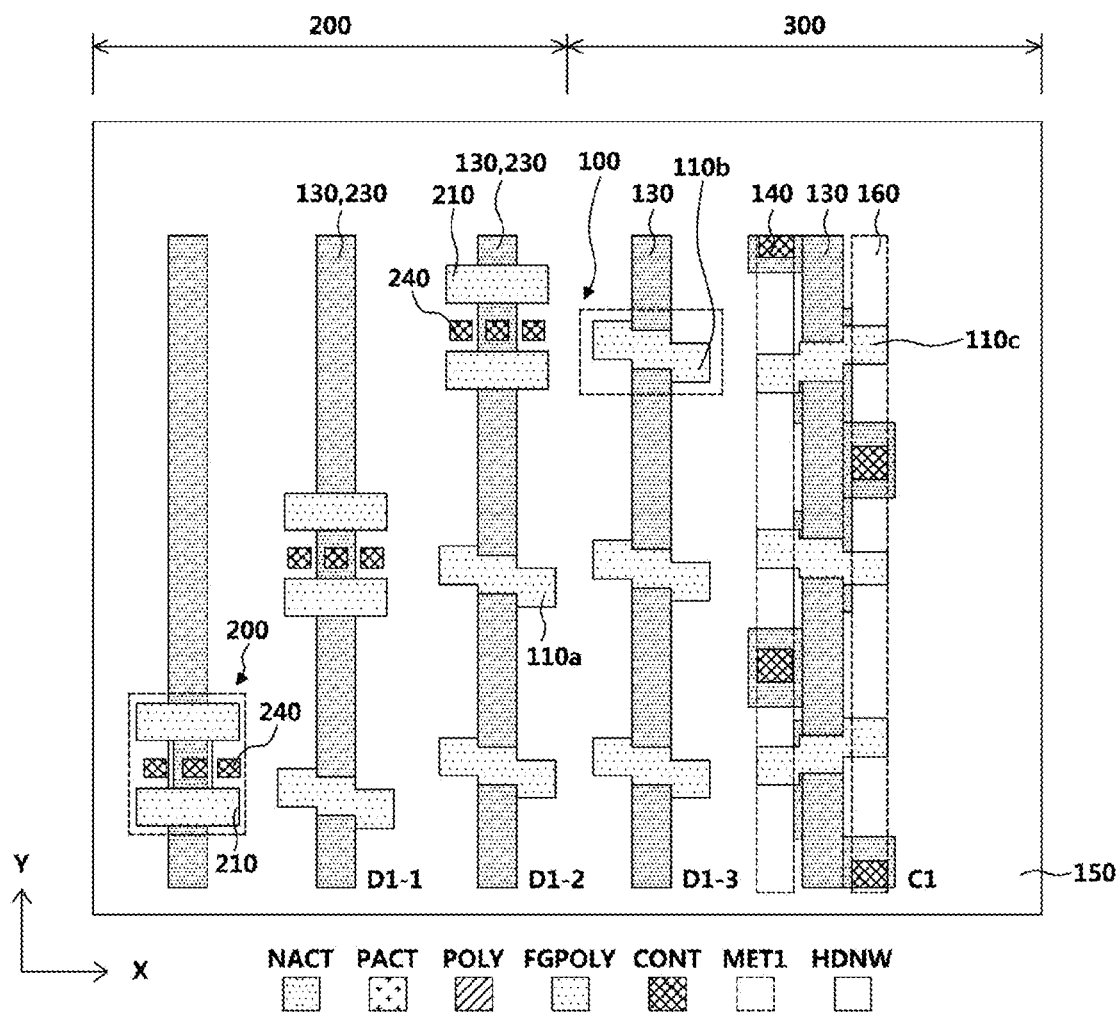
FIG. 9 is a diagram showing a nonvolatile memory device including a control gate pickup structure according to another example.

FIG. 9 is a diagram showing a nonvolatile memory device including a control gate pickup structure according to another example.

According to the example of FIG. 9, another example includes a cell array 300 and a control gate pickup structure 200. The cell array 300 may include floating gates (FG) 110a, 110b, and 110c and a control gate (CG) 120. The control gate pickup structure 200 may be connected to the control gate (CG) 120. A long axis's direction of the floating gate polysilicon layer 210 in FIG. 9 may be opposite to a long axis's direction of the floating gate polysilicon layer 210 in FIG. 6A or FIG. 6B.

According to the example of FIG. 9, at least one contact plug 240 may be formed between the floating gate polysilicon layers (FG Poly-Si layers) 210. The contact plug 240 and the floating gate polysilicon layers (FG Poly-Si layers) 210 may not be in contact with each other, so it is preferable that a sufficient space is formed among the double floating gate polysilicon layers (FG Poly-Si layer) 210.

According to the example of FIG. 9, the floating gate polysilicon layers (FG Poly-Si layer) 210 in the control gate pickup structure according to an example may be formed to have a long axis and a short axis, in which the long axis is formed in a direction that coincides with, that is, is parallel to a word line WL, that is, an x-axis direction.

Although no bit line contacts or source line contacts may be formed in the dummy cell line D1, the control gate 120 may be extended to the dummy cell lines D1-1, D1-2 and D1-3. Thus, the control gate 120 in the dummy cell lines D1-1, D1-2 and D1-3 may be connected to a control gate 120 in the internal cell lines C1. The control gate poly-Si 220 in the control gate pickup structure 200 may be electrically connected to the control gate (CG) 120 formed in the internal cell lines, because the control gate 120 in the dummy cell lines D1-1, D1-2 and D1-3 are connected to both the control gate poly-Si 220 in the control gate pickup structure 200 and the control gate (CG) 120 formed in the internal cell lines C1. That is, each control gate pickup structure 200 is connected to any one of a plurality of internal unit cells C1, C2, and C3 in the cell array 300.

According to the example of FIG. 9, a substrate 10, which is a base for integrating nonvolatile memory devices, may be formed as a P-type conductive substrate 10, for example, a silicon substrate. A deep N-type well 150 may be formed below a P-type well 50, so it may be possible to separate the P-type well 50 from the substrate 10 and it therefore may be possible to prevent hot carriers and so on produced by the semiconductor substrate 10 from entering the P-type well 50.

Figure 10:
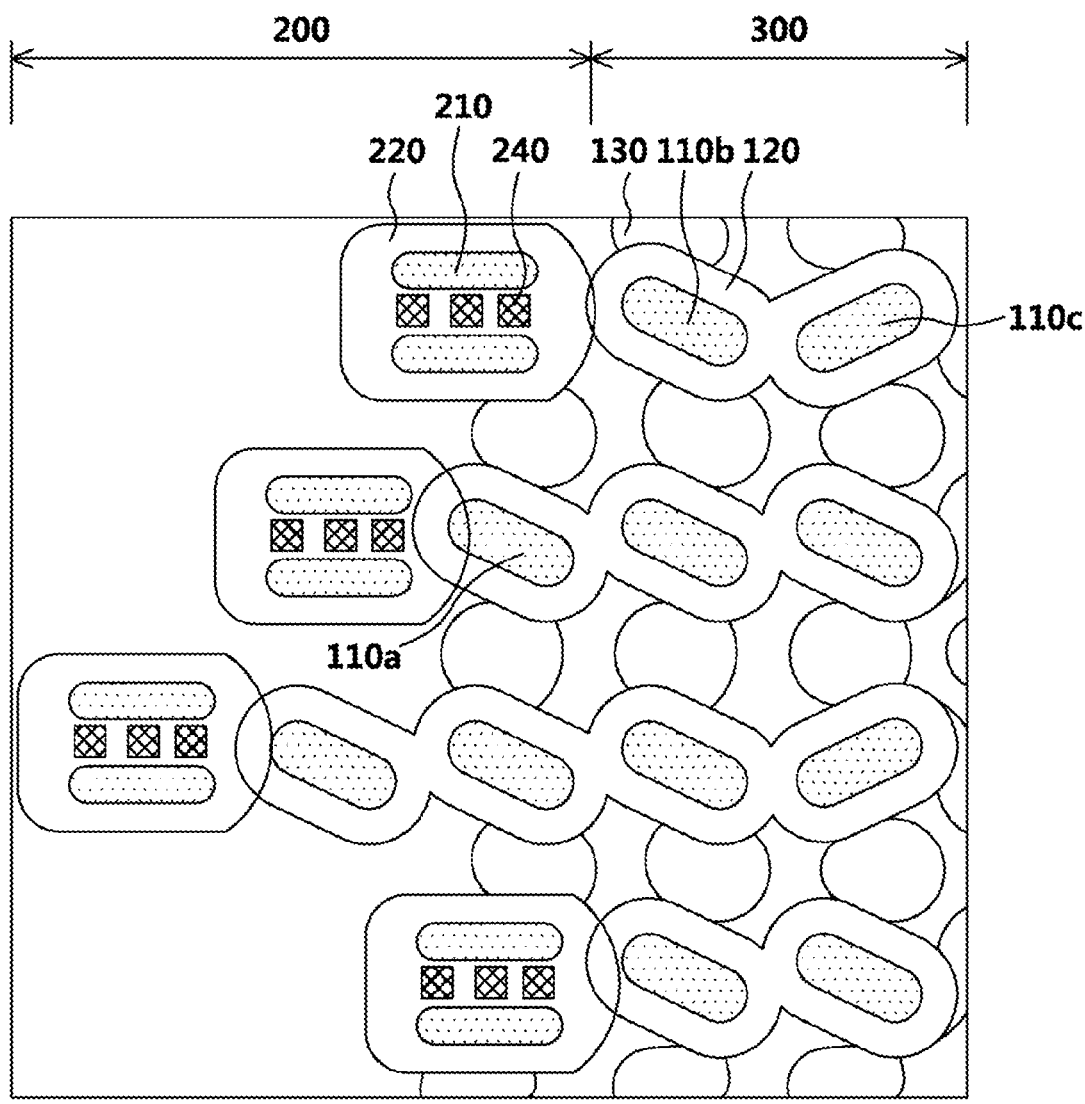
FIG. 10 is a diagram showing a nonvolatile memory device including a control gate pickup structure according to another example.

FIG. 10 is a diagram showing a nonvolatile memory device including a control gate pickup structure according to another example.

According to the example of FIG. 10, another example includes a cell array 300 and a control gate pickup structure 200. The cell array 300 may include floating gates (FG) 110a, 110b, and 110c and a control gate (CG) 120. The control gate pickup structure may be connected to the control gate (CG) 120. The control gate pickup structure 200 may be formed on an active region 130.

Figure 11A:
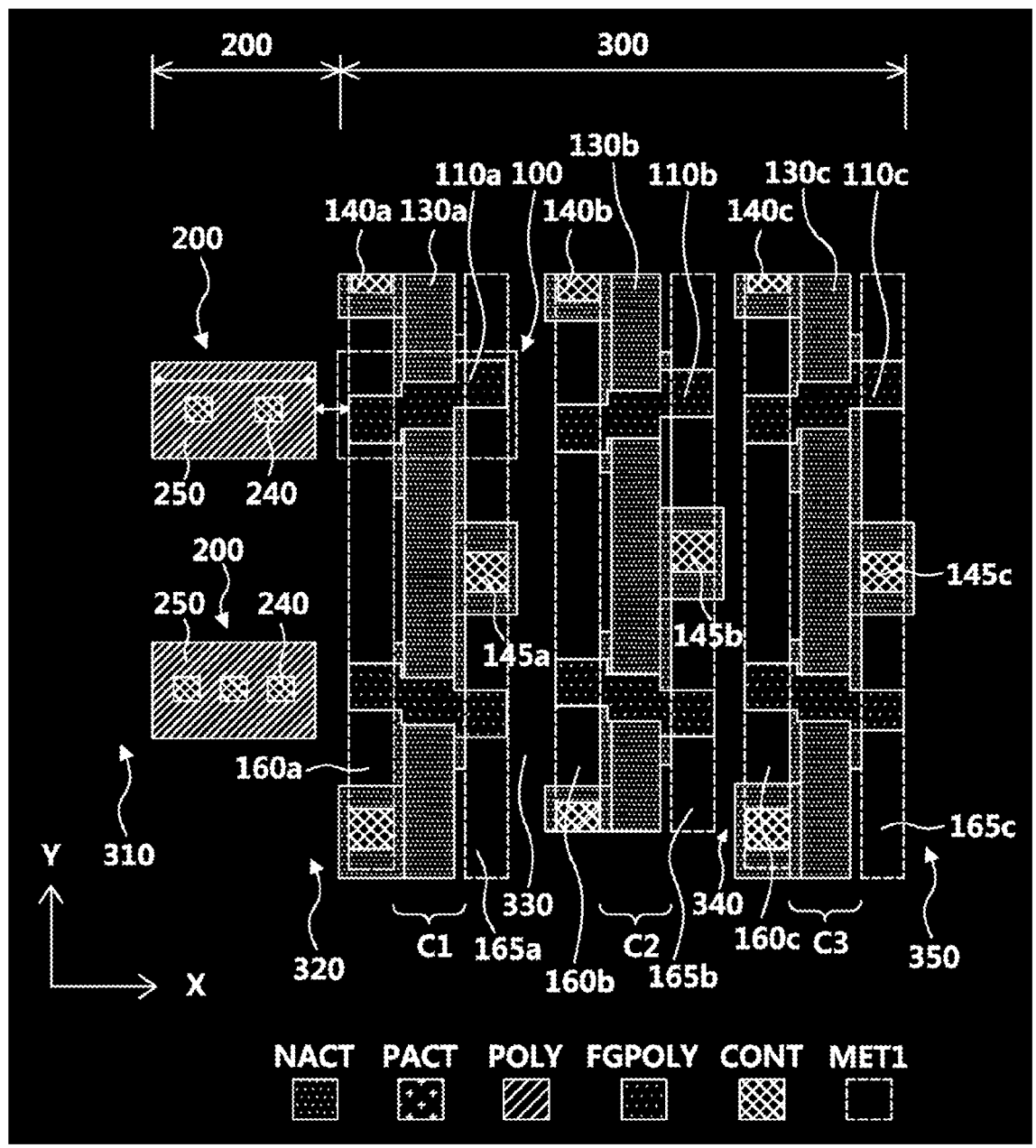
FIG. 11A is a layout diagram in which the array of floating gates of a nonvolatile memory cell according to another example has been changed.

FIG. 11A is a layout diagram in which the array of floating gates of the nonvolatile memory cell according to another example has been changed.

According to the example of FIG. 11A, the present disclosure may include a cell array 300 including floating gates (FG) 110a, 110b, and 110c, and a control gate pickup structure 200 electrically connected to the plurality of cells 100. As a difference from other examples, there may be no floating gate polysilicon layer 210 in the control gate pickup structure 200. Thus, there is only a control gate polysilicon layer 250. Accordingly, there is a possibility that a polysilicon peak may be formed.

Figure 11B:
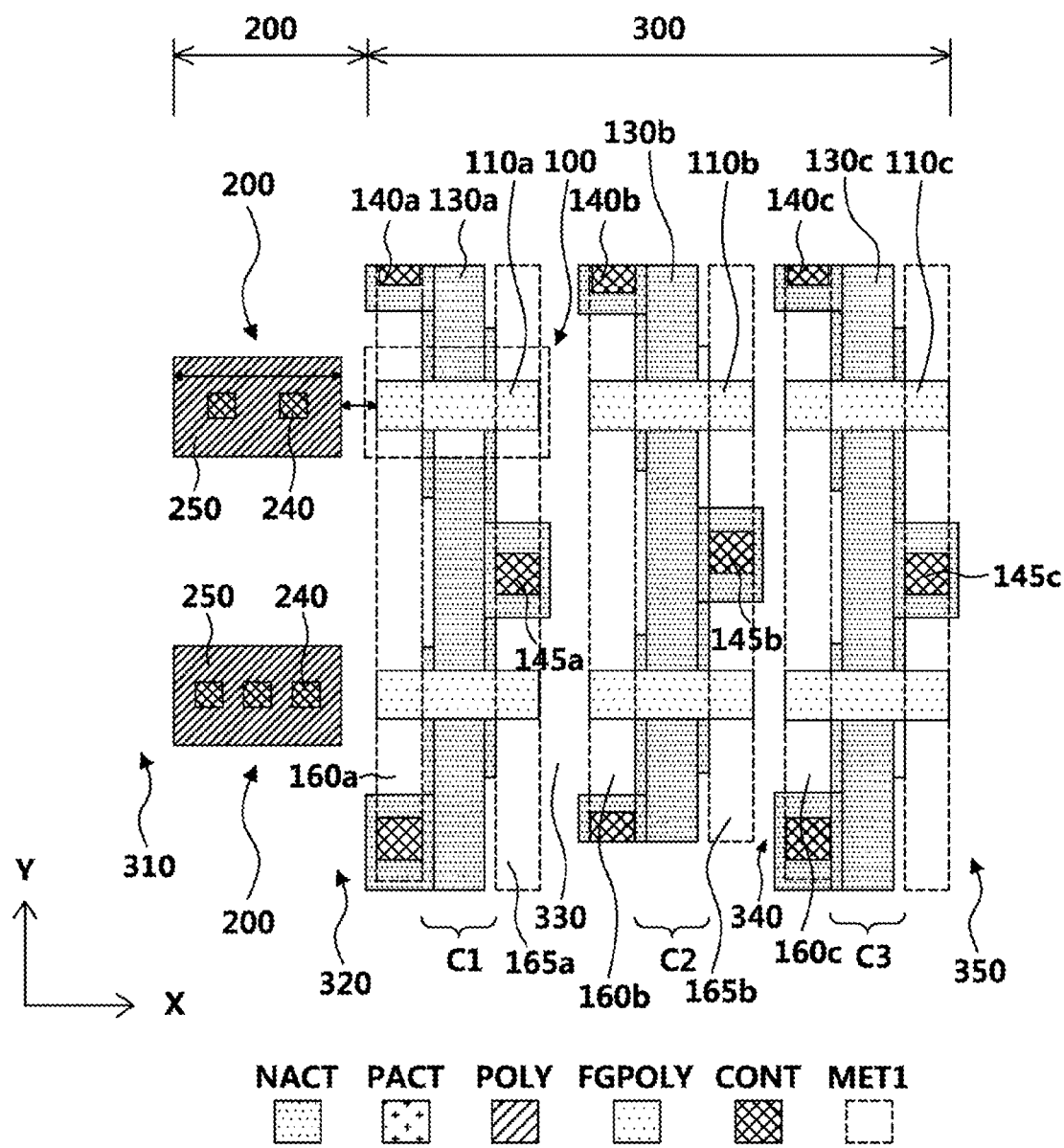
FIG. 11B is a layout diagram showing a nonvolatile memory device according to another example.

FIG. 11B is a layout diagram showing a nonvolatile memory device according to another example.

Referring to the example of FIG. 11B, the floating gates (FG) 110a, 110b, and 110c may have a rectangular shape rather than a stepped rectangular shape, as shown in the example of FIG. 6A, or an oval or a round shape as shown in the example of FIG. 4. Unit cell 100 may include a long axis (X-axis) and a short axis (Y-axis) and the long axis (X-axis) may coincide with a word line WL. That is, the plurality of cells may be connected in parallel with each other. The cell array 300 may include floating gates (FG) 110a, 110b, and 110c, and also a control gate pickup structure 200 electrically connected to the cell array 300. The floating gates (FG) 110a, 110b, and 110c may be composed of three blocks, but are not limited to this number of pieces. Thus, in other examples, there may be a number of floating gates that differs from three. The blocks may be arranged such that the central axes of the blocks are parallel with the word line WL. Polysilicon is generally used for the floating gates (FG) 110*a*, 110*b*, and 110*c*. However, other examples possibly use other materials, with similar properties for the floating gates (FG) 110*a*, 110*b*, and 110*c*. When the central axes of a plurality of blocks constituting the floating gates (FG) 110*a*, 110*b*, and 110*c* coincide with the word line WL, a problem may arise that the entire area of the nonvolatile memory device may therefore increase. Accordingly, it may be helpful to have a nonvolatile memory device in which a plurality of cells are differently arrayed in order to be able to include a plurality of more cells in the same area. Further, the control gate pickup structure 200 includes a polysilicon layer 250 and a plurality of contact plugs 240 formed on polysilicon.

Figure 12:
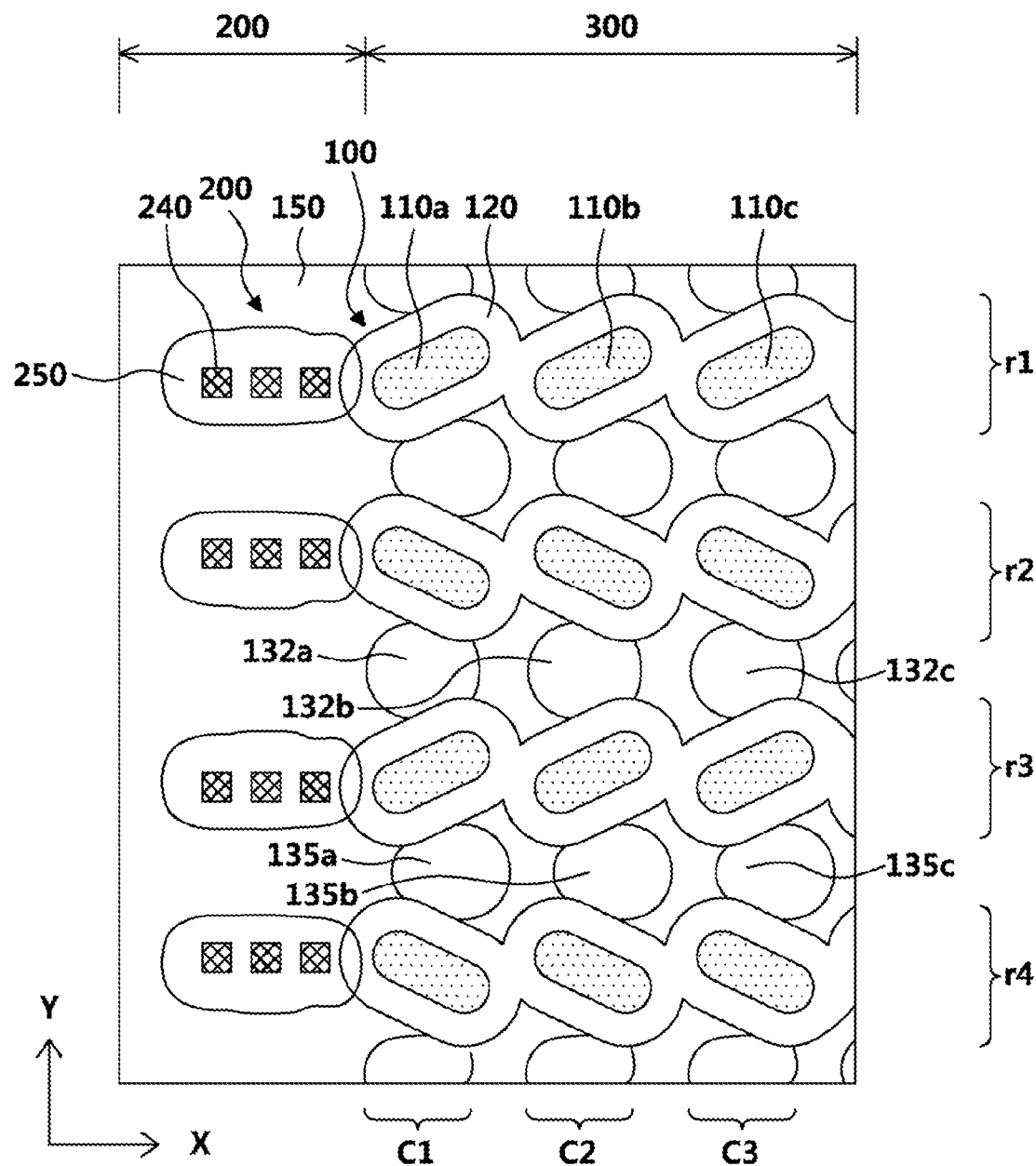
FIG. 12 is a diagram showing a nonvolatile memory device including a control gate pickup structure according to another example.

FIG. 12 is a diagram showing a nonvolatile memory device including a control gate pickup structure according to another example.

According to the example of FIG. 12, another example includes a cell array 300 including floating gates (FG) 110*a*, 110*b*, and 110*c* and a control gate (CG) 120, and a control gate pickup structure 200 connected to the control gate (CG) 120. Each of the floating gates (FG) 110*a*, 110*b*, and 110*c* may have an oval or round or stepped rectangular shape. In such an example, there may be no floating gate polysilicon layer in the control gate pickup structure 200. However, in this example, only a control gate polysilicon layer 250 may exists. Similarly, there is a possibility that a polysilicon peak may be formed in this structure.

FIG. 13 is a cross-sectional view showing a nonvolatile memory device including a control gate pickup structure according to another example.

FIG. 13 is a cross-section formed from the examples of previous drawings FIG. 11A, FIG. 11B, FIG. 12, and so on. The control gate pickup structure 200 may have a control gate pickup flat structure 250A and a control gate pickup cone structure 250B. When the control gate pickup cone structure 250B is formed, the height may be changed in each process, and when the height is formed to result in a structure being too close to a pickup metal line 260 or over the pickup metal line, the device may be shorted or broken when the device operates. When the control gate pickup cone structure 250B is formed too high, a silicide 290 may not be formed well. Accordingly, a non-silicide region may be formed, and thus the resistance value of a control gate may increase.

The nonvolatile memory device of the present examples, described above, may be able to increase stability of a device by removing a polysilicon peak.

Furthermore, the nonvolatile memory device of the present examples described above may not need to secure a height by a polysilicon peak, so there is an effect that it may be possible to manufacture a nonvolatile memory device with a smaller height.

Furthermore, the nonvolatile memory device of the present examples described above may have an effect that it may be possible to prevent a leakage current by removing a polysilicon peak.

Furthermore, the nonvolatile memory device of the present examples described above may have an effect that may be possible to include a plurality of additional cells in the same area.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A cell array in a nonvolatile memory device, the cell array comprising:
    a first floating gate of an odd row and a second floating gate of an even row spaced apart from each other and formed on a substrate;
    a first control gate surrounding the first floating gate of the odd row and tilted positively with respect to an X-axis; and
    a second control gate surrounding the second floating gate of the even row and tilted negatively with respect to the X-axis.

2. The cell array of claim 1, wherein the first floating gate is tilted positively with respect to the X-axis, and
    wherein the second floating gate is tilted negatively with respect to the X-axis.

3. The cell array of claim 1, further comprising a first source line contact disposed between the first control gate and the second control gate,
    wherein the first source line contact is disposed to be aligned with ends of the first floating gate and the second floating gate.

4. The cell array of claim 3, further comprising a first bit line contact disposed diagonally to the first source line contact,
    wherein the first bit line contact is disposed to be aligned with the other ends of the first floating gate and the second floating gate.

5. The cell array of claim 3, wherein a distance between the ends of the first floating gate and the second floating gate is the longest in a space between the first floating gate and the second floating gate.

6. The cell array of claim 4, wherein the first bit line contact and the first source line contact are disposed in active areas that partially protrude at both sides of active regions.

7. The cell array of claim 1, further comprising a first dummy cell line, wherein the first dummy cell line comprises:
    a first dummy floating gate disposed adjacent to the first floating gate of the odd row, and tilted positively with respect to the X-axis; and
    a second dummy floating gate disposed adjacent to the second floating gate of the even row, and tilted negatively with respect to the X-axis.

8. The cell array of claim 7, wherein the first dummy cell line has no bit line contacts or source line contacts.

9. A cell array in a nonvolatile memory device, the cell array comprising:
    first floating gates disposed in a first row on a substrate;
    second floating gates disposed in a second row;
    a first control gate surrounding the first floating gates, the first control gate comprising first sub-control gates connected to each other, and each of the first sub-control gates being tilted positively with respect to an X-axis; and a second control gate surrounding the second floating gates, the second control gate comprising second sub-control gates connected to each other, and each of the second sub-control gates being tilted negatively with respect to the X-axis.

10. The cell array of claim 9, further comprising:
first source line contacts disposed between the first control gate and the second control gate; and
first bit line contacts disposed diagonally to the first source line contacts.

11. The cell array of claim 10, wherein each of the first source line contacts is disposed to be aligned with ends of each of the first floating gates and each of the second floating gates.

12. The cell array of claim 9, wherein each of the first sub-control gates has a first long axis and a first short axis, and a direction of the first long axis is tilted up or down with respect to the X-axis.

13. A cell array in a nonvolatile memory device, the cell array comprising:

a first floating gate of an odd row tilted positively with respect to an X-axis on a substrate;

a second floating gate of an even row tilted negatively with respect to the X-axis, and spaced apart from the first floating gate of the odd row;

a first control gate surrounding the first floating gate of the odd row; and a second control gate surrounding the second floating gate of the even row.

14. The cell array of claim 13, wherein the first control gate is tilted positively with respect to the X-axis, and wherein the second control gate is tilted negatively with respect to the X-axis.

15. The cell array of claim 13, further comprising:
a first control gate polysilicon layer connected to the first control gate;
a first floating gate polysilicon layer adjacent to the first control gate polysilicon layer; and
at least one contact plug disposed on the first control gate polysilicon layer.

* * * * *